(12) United States Patent
Cheng et al.

(10) Patent No.: US 9,984,967 B2
(45) Date of Patent: May 29, 2018

(54) SEMICONDUCTOR STRUCTURE AND MANUFACTURING METHOD THEREOF

(71) Applicant: TAIWAN SEMICONDUCTOR MANUFACTURING CO., LTD., Hsinchu (TW)

(72) Inventors: Kai-Yu Cheng, New Taipei (TW); Shih-Kang Tien, Hsinchu (TW); Ching-Kun Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days. days.

(21) Appl. No.: 15/065,770

(22) Filed: Mar. 9, 2016

(65) Prior Publication Data

US 2017/0179021 A1    Jun. 22, 2017

Related U.S. Application Data

(60) Provisional application No. 62/270,455, filed on Dec. 21, 2015.

(51) Int. Cl.
| | | |
|---|---|---|
| *H01L 23/528* | (2006.01) | |
| *H01L 21/768* | (2006.01) | |
| *H01L 23/522* | (2006.01) | |
| *H01L 23/532* | (2006.01) | |

(52) U.S. Cl.
CPC ...... *H01L 23/528* (2013.01); *H01L 21/76816* (2013.01); *H01L 21/76831* (2013.01); *H01L 21/76843* (2013.01); *H01L 23/5226* (2013.01); *H01L 23/5329* (2013.01); *H01L 23/53223* (2013.01); *H01L 23/53238* (2013.01); *H01L 23/53252* (2013.01); *H01L 23/53266* (2013.01); *H01L 23/53295* (2013.01)

(58) Field of Classification Search
CPC ......... H01L 21/76843; H01L 21/53266; H01L 21/53295; H01L 21/5266
See application file for complete search history.

(56) References Cited

U.S. PATENT DOCUMENTS

| | | | |
|---|---|---|---|
| 6,657,692 B2 * | 12/2003 | Shiota | G02F 1/136227 349/138 |
| 9,576,892 B2 | 2/2017 | Chi et al. | |
| 2007/0045836 A1 | 3/2007 | Kwon et al. | |

(Continued)

FOREIGN PATENT DOCUMENTS

TW        201511101 A       3/2015

*Primary Examiner* — Mounir Amer
(74) *Attorney, Agent, or Firm* — Slater Matsil, LLP

(57) ABSTRACT

A semiconductor structure includes a first dielectric layer, a first conductive via, a partial landing pad, a second dielectric layer, and a second conductive via. The first conductive via is disposed in the first dielectric layer. The partial landing pad is disposed on the first conductive via and the first dielectric layer, in which the partial landing pad has a top surface and a bottom surface, and the top surface of the partial landing pad has a width greater than or substantially equal to that of the bottom surface of the partial landing pad. The second dielectric layer is disposed on the partial landing pad. The second conductive via is disposed in the second dielectric layer and electrically connected to the partial landing pad.

19 Claims, 14 Drawing Sheets

(56) References Cited

U.S. PATENT DOCUMENTS

2008/0272490 A1* 11/2008 Kim ................ H01L 21/32136
                                                    257/751
2014/0167772 A1   6/2014 Bonilla et al.
2015/0097291 A1   4/2015 Huisinga et al.
2015/0206797 A1   7/2015 Meinhold et al.
2016/0027738 A1* 1/2016 Murray ............ H01L 23/53295
                                                    257/751

* cited by examiner

SEMICONDUCTOR STRUCTURE AND MANUFACTURING METHOD THEREOF

RELATED APPLICATIONS

This application claims priority to U.S. Provisional Application Ser. No. 62/270,455, filed Dec. 21, 2015, which is herein incorporated by reference.

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area.

The word "interconnection" in integrated circuits means conductive lines which connect the various electronic components. The interconnecting conductive lines are separated from the substrate by insulating layers, except on the contact area. As feature densities increase, the widths of the conductive lines and the spacing between the conductive lines of interconnect structures also scale smaller.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
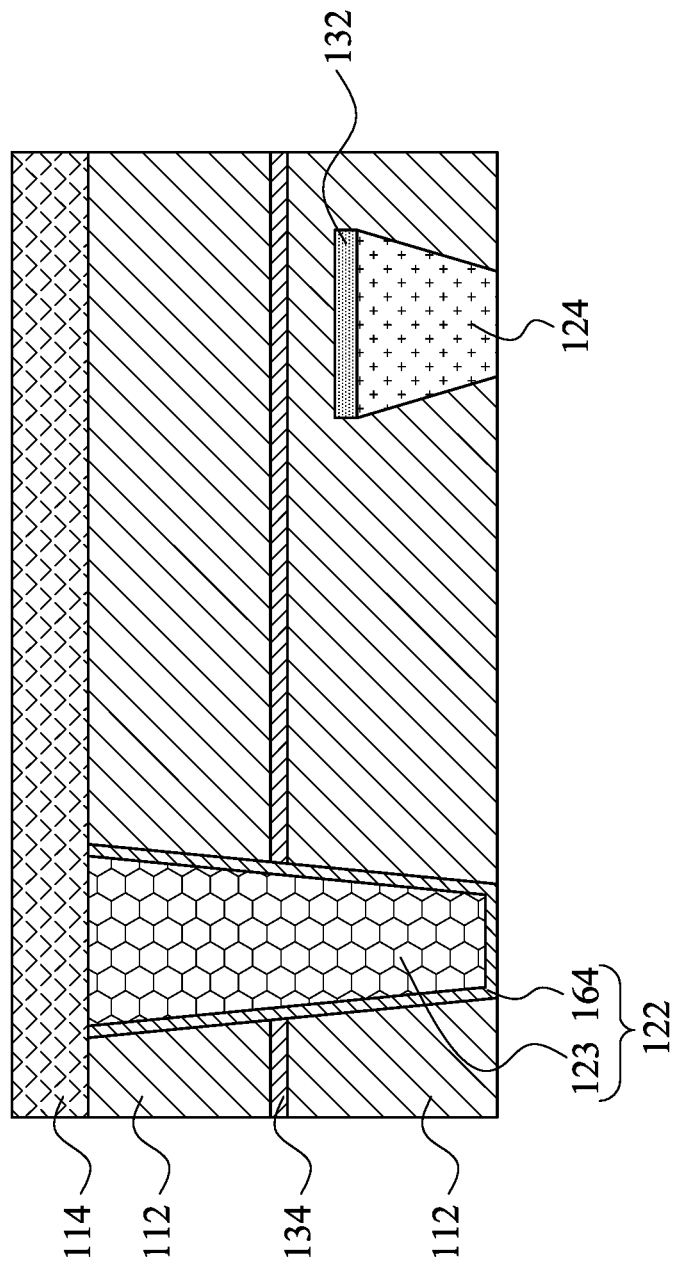
FIGS. 1-14 are cross-sectional views of a method for manufacturing a semiconductor structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by the person having ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1-14 are cross-sectional views of a method for manufacturing a semiconductor structure 100 at various stages in accordance with some embodiments of the present disclosure.

Reference is made to FIG. 1. A semiconductor structure is provided, in which at least one conductive via 122 is disposed in one or more dielectric layers 112. The dielectric layers 112 are interlayer dielectric (ILD) layers formed on a semiconductor substrate. At least one of the dielectric layers 112 is made of a dielectric material, such as silicon oxide, silicon nitride, silicon oxynitride, or combinations thereof. In some embodiments, the dielectric layers 112 are made of a low-κ dielectric material to improve resistive-capacitive (RC) delay. The dielectric constant of the low-κ dielectric material is lower than that of silicon dioxide ($SiO_2$). One approach to reduce the dielectric constant of a dielectric material is to introduce carbon (C) or fluorine (F) atoms. For example, in $SiO_2$ (κ=3.9), the introduction of C atoms to form hydrogenated carbon-doped silicon oxide (SiCOH) (κ is between 2.7 and 3.3) and the introduction of F atoms to form fluorosilicate glass (FSG) (κ is between 3.5 and 3.9) reduces its dielectric constant. Another approach to reduce the dielectric constant of a dielectric material is by introducing an air gap or pores. Since the dielectric constant of air is 1, the dielectric constant of a dielectric film can be reduced by increasing the porosity of the dielectric film. In some embodiments, the low-κ dielectric material is, for example, porous silicon oxide (i.e. the xerogel or the aerogel), nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, or combinations thereof. The dielectric layer 112 is formed by, for example, chemical vapor deposition (CVD), spin coating, or combinations thereof.

In some embodiments, the pitch between different conductive vias 122 is in a range from about 44 nm to about 90 nm. Embodiments of this disclosure are not limited thereto.

The conductive via 122 may include a conductor 123 and a barrier layer 164. The conductor 123 is made of metal, such as copper (Cu), aluminum (Al), tungsten (W), nickel (Ni), cobalt (Co), titanium (Ti), platinum (Pt), tantalum (Ta), or combinations thereof. The conductor 123 is formed by, for example, electrochemical deposition, physical vapor deposition (PVD), chemical vapor deposition (CVD), or combinations thereof.

The barrier layer 164 is formed between the conductor 123 and the dielectric layers 112. The barrier layer 164 is made of a material which can adhere the conductor 123 to the dielectric layers 112 and stop diffusion of the conductor 123 into the dielectric layers 112. In some embodiments, when the conductor 123 is made of copper (Cu), the barrier layer 164 is made of, for example, tantalum nitride (TaN), tantalum (Ta)/TaN, Ta, other transition metal based materials, or combinations thereof. In some other embodiments, when the conductor 123 is made of aluminum (Al), the barrier layer 164 is made of, for example, titanium nitride (TiN), titanium (Ti)/TiN, Ti, other transition metal based materials, or combinations thereof. The barrier layer 164 is formed by, for example, physical vapor deposition (PVD), ionized physical vapor deposition (IPVD), atomic layer deposition (ALD), chemical vapor deposition (CVD), or combinations thereof.

Moreover, at least one conductor 124 is disposed in the lower dielectric layer 112. The conductor 124 may function as a gate. Specifically, the conductor 124 may include titanium aluminum (TiAl) (which may include, or free from or substantially free from other elements) in accordance with some embodiments. The formation of the conductor 124 may be achieved through physical vapor deposition (PVD). In accordance with some embodiments of the present disclosure, the conductor 124 is formed at room temperature (for example, from about 20° C. to about 25° C.). In alternative embodiments, the conductor 124 is formed at an elevated temperature higher than the room temperature, for example, higher than about 200° C.

A hard mask layer 132 is disposed in the lower dielectric layer 112 and on the conductor 124. The hard mask layer 132 may include, for example, silicon nitride or the like. The hard mask layer 132 may be formed using chemical vapor deposition (CVD), physical vapor deposition (PVD), atomic layer deposition (ALD), other suitable processes, or combinations thereof.

Additionally, a middle contact etch stop layer (middle CESL) 134 is disposed between the dielectric layers 112. The conductive via 122 passes through the middle CESL 134, and the conductor 124 and the hard mask layer 132 are disposed below the middle CESL 134. The middle CESL 134 may include, for example, silicon nitride or the like. The middle CESL 134 may be formed using chemical vapor deposition (CVD), physical vapor deposition (PVD), atomic layer deposition (ALD), other suitable processes, or combinations thereof.

A dielectric layer 114 is formed on the upper dielectric layer 112 and the conductive via 122. The dielectric layer 114 is an interlayer dielectric (ILD) layer as well. The dielectric layer 114 is made of a dielectric material, such as silicon oxide, silicon nitride, silicon oxynitride, or combinations thereof. In some embodiments, the dielectric layer 114 is made of a low-κ dielectric material, such as hydrogenated carbon-doped silicon oxide (SiCOH), fluorosilicate glass (FSG), porous silicon oxide (i.e. the xerogel or the aerogel), nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, or combinations thereof. The dielectric layer 114 is formed by, for example, chemical vapor deposition (CVD), spin coating, or combinations thereof. In some embodiments, the dielectric layer 114 has a thickness in a range from about 450 Å to about 900 Å.

Figure 2:
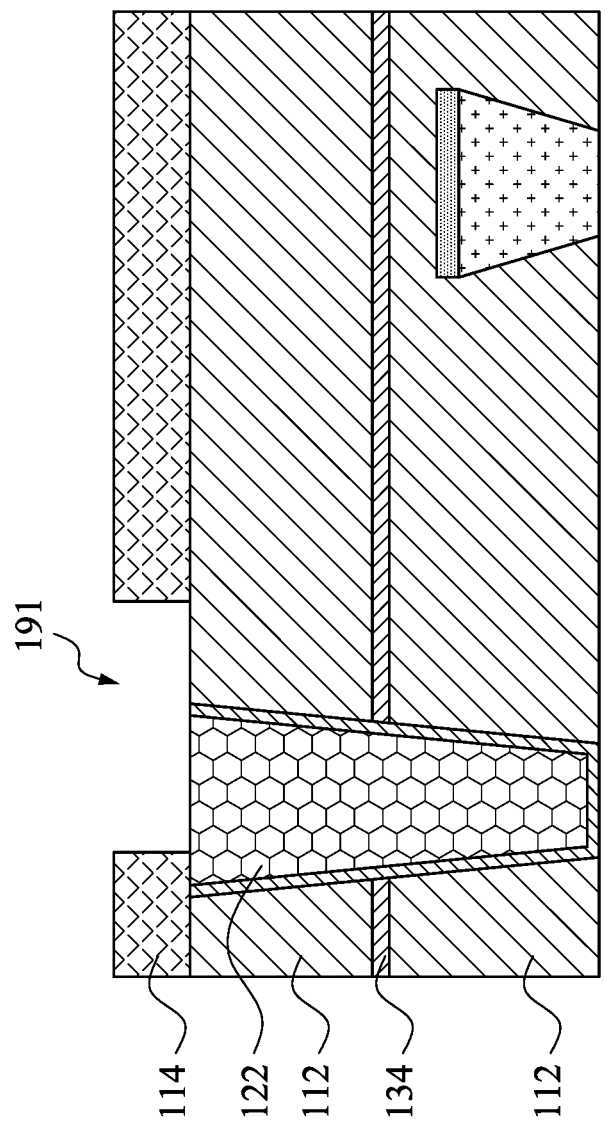

In FIG. 2, an opening 191 is formed in the dielectric layer 114 to expose a part of a top surface of the conductive via 122 and a part of the dielectric layer 112. The opening 191 is formed by a photolithography and etching process. The photolithography and etching process includes photoresist application, exposure, developing, etching, and photoresist removal. A photoresist is applied onto the dielectric layer 114 by, for example, spin coating. The photoresist is then prebaked to drive off excess photoresist solvent. After prebaking, the photoresist is exposed to a pattern of intense light.

The intense light is, for example, a G-line with a wavelength of about 436 nm, an I-line with a wavelength of about 365 nm, a krypton fluoride (KrF) excimer laser with a wavelength of about 248 nm, an argon fluoride (ArF) excimer laser with a wavelength of about 193 nm, a fluoride ($F_2$) excimer laser with a wavelength of about 157 nm, or combinations thereof. A space between the final lens of the exposure tool and the photoresist surface may be filled with a liquid medium that has a refractive index greater than one during the exposure to enhance the photolithography resolution. The exposure to light causes a chemical change that allows some of the photoresist soluble in a photographic developer.

Then, a post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hard-baked to solidify the remaining photoresist.

At least one portion of the dielectric layer 114 which is not protected by the remaining photoresist is etched to form the opening 191. The etching of the dielectric layer 114 may be dry etching, such as reactive ion etching (RIE), plasma enhanced (PE) etching, or inductively coupled plasma (ICP) etching. In some embodiments, when the dielectric layer 114 is made of silicon oxide, fluorine-based RIE can be used to form the opening 191. The gas etchant used to dry etch the dielectric layer 114 is, for example, $CF_4/O_2$, $ClF_3$, $CCl_3F_5$, $SF_4/O_2$, or combinations thereof.

After the opening 191 is formed, the photoresist is removed from the dielectric layer 114 by, for example, plasma ashing, stripping, or combinations thereof. Plasma ashing uses a plasma source to generate a monatomic reactive species, such as oxygen or fluorine. The reactive species combines with the photoresist to form ash which is removed with a vacuum pump. Stripping uses a photoresist stripper, such as acetone or a phenol solvent, to remove the photoresist from the dielectric layer 114.

Figure 3:
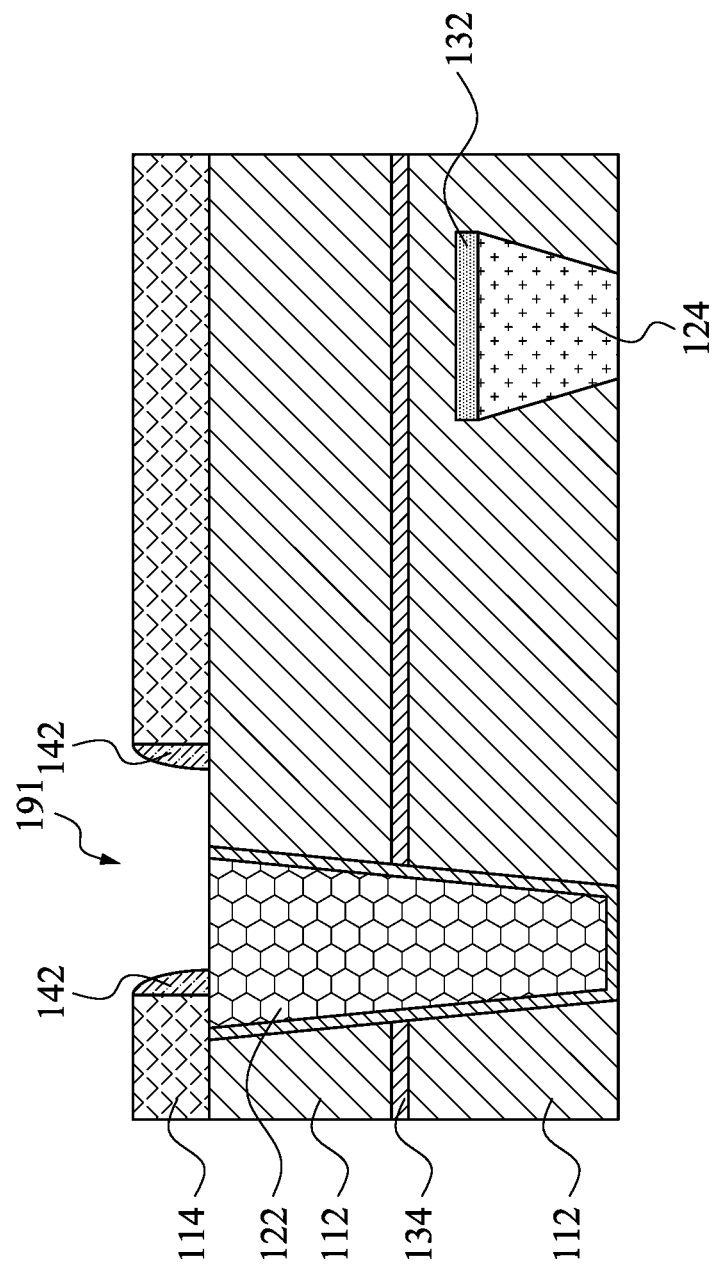

In FIG. 3, at least one etch stop spacer 142 is formed on at least one sidewall of the opening 191. In some embodiments, the etch stop spacer 142 is made of a carbon-rich material, such as silicon carbon nitride (SiCN). The etch stop spacer 142 is formed by performing a deposition process and then performing an etching process. For example, plasma-enhanced chemical vapor deposition (PECVD) is performed first, such that a dielectric layer is formed on a top surface of the dielectric layer 114 and at least one sidewall and a bottom surface of the opening 191, and then an anisotropic etching, such as $O_2$ plasma etching, $N_2$ plasma etching, $H_2$ plasma etching, or combinations thereof, is performed to remove the dielectric layer on the top surface of the dielectric layer 114 and the bottom surface of the opening 191 while leaving the etch stop spacer 142 on the sidewall of the opening 191. In addition, a width of the etch stop spacer 142 decreases or remains substantially constant as a height of the etch stop spacer 142 increases. That is, a top surface of the etch stop spacer 142 has a width less than or substantially equal to that of a bottom surface of the etch stop spacer 142. In other words, the width of the top surface of the etch stop spacer 142 is not greater than that of the bottom surface of the etch stop spacer 142. In some embodiments, a width of the bottom surface of the etch stop spacer 142 is in a range from about 10 Å to 70 Å.

Figure 4:
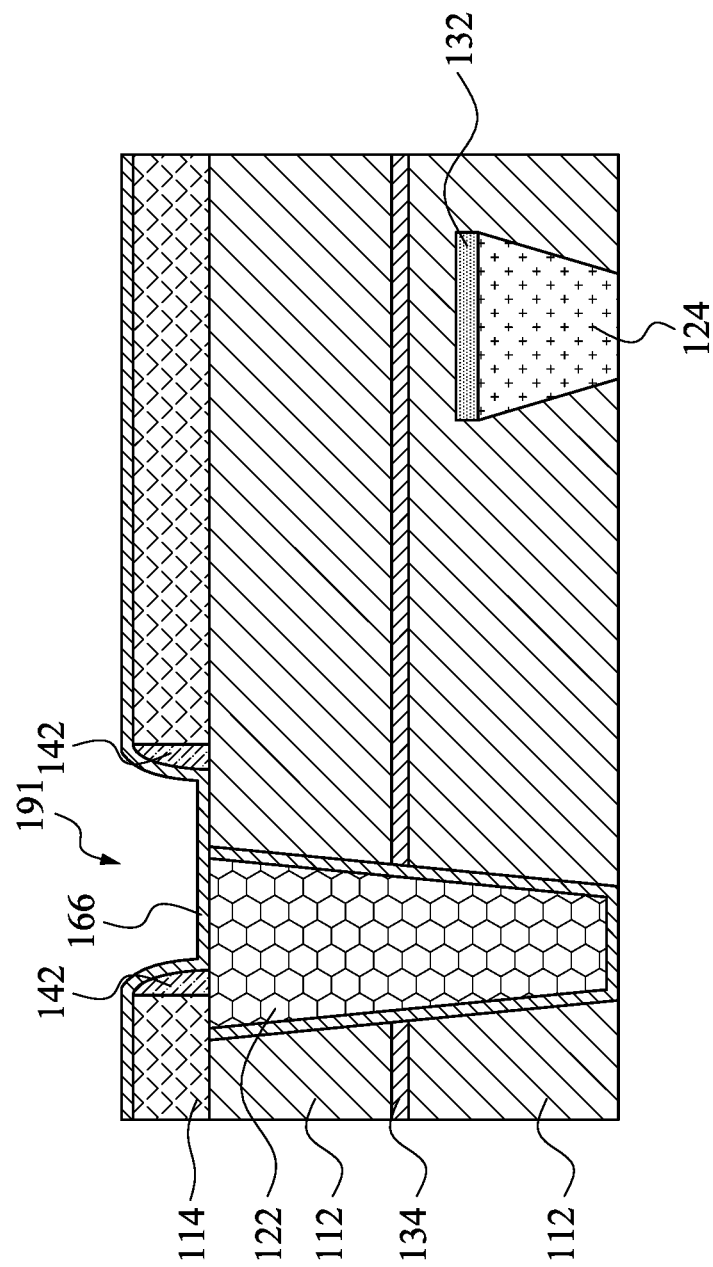

Reference is made to FIG. 4. A barrier layer 166 may be formed on at least one sidewall of the opening 191 (i.e., at least one sidewall of the etch stop spacer 142), the bottom surface of the opening 191 (i.e., the upper dielectric layer 112 and the conductive via 122), and the top surface of the dielectric layer 114. The barrier layer 166 may be formed by performing a deposition process, such as plasma-enhanced chemical vapor deposition (PECVD).

Figure 5:
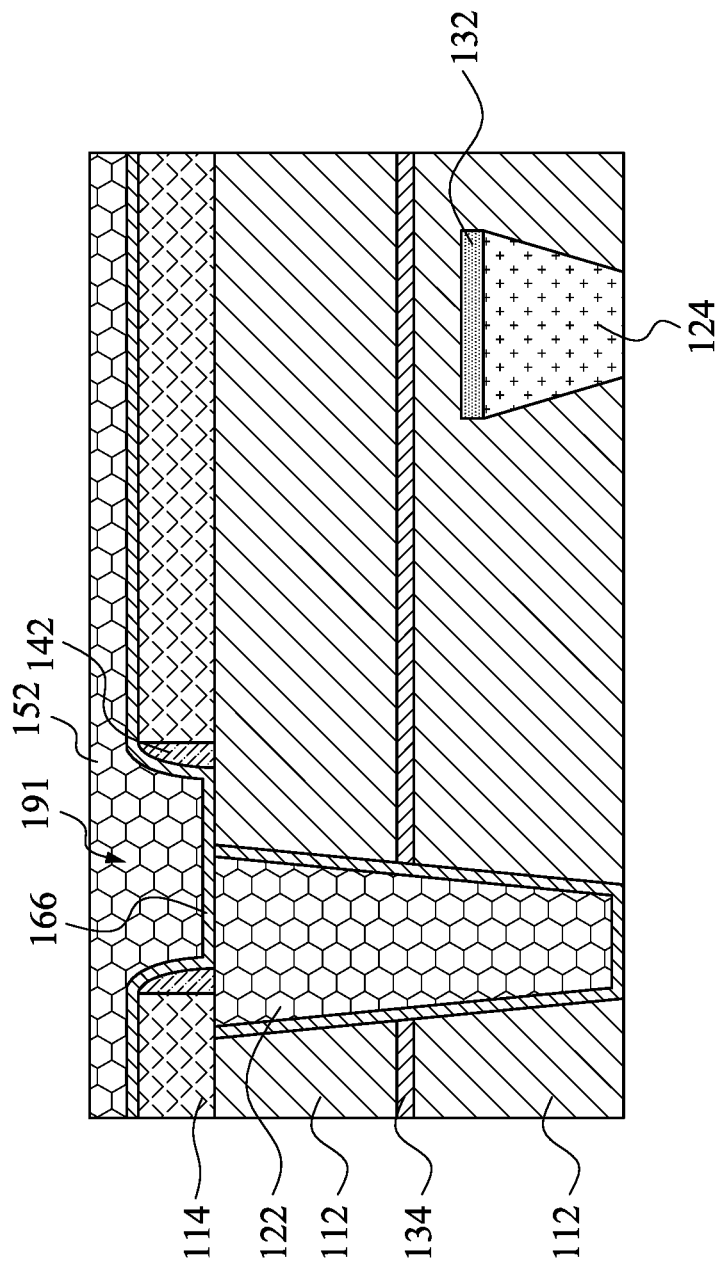

Reference is made to FIG. 5. A conductive layer 152 overfills the opening 191. The conductive layer 152 is made of metal, such as copper (Cu), aluminum (Al), tungsten (W), nickel (Ni), cobalt (Co), titanium (Ti), platinum (Pt), tantalum (Ta), or combinations thereof. The conductive layer 152 is formed by, for example, electrochemical deposition, physical vapor deposition (PVD), chemical vapor deposition (CVD), or combinations thereof.

The barrier layer 166 is made of a material which can adhere the conductive layer 152 to the etch stop spacer 142 and stop diffusion of the conductive layer 152 into the etch stop spacer 142. In some embodiments, when the conductive layer 152 is made of copper (Cu), the barrier layer 166 is made of, for example, tantalum nitride (TaN), tantalum (Ta)/TaN, Ta, other transition metal based materials, or combinations thereof. In some other embodiments, when the conductive layer 152 is made of aluminum (Al), the barrier layer 166 is made of, for example, titanium nitride (TiN), titanium (Ti)/TiN, Ti, other transition metal based materials, or combinations thereof. The barrier layer 166 is formed by, for example, physical vapor deposition (PVD), ionized physical vapor deposition (IPVD), atomic layer deposition (ALD), chemical vapor deposition (CVD), or combinations thereof.

Figure 6:
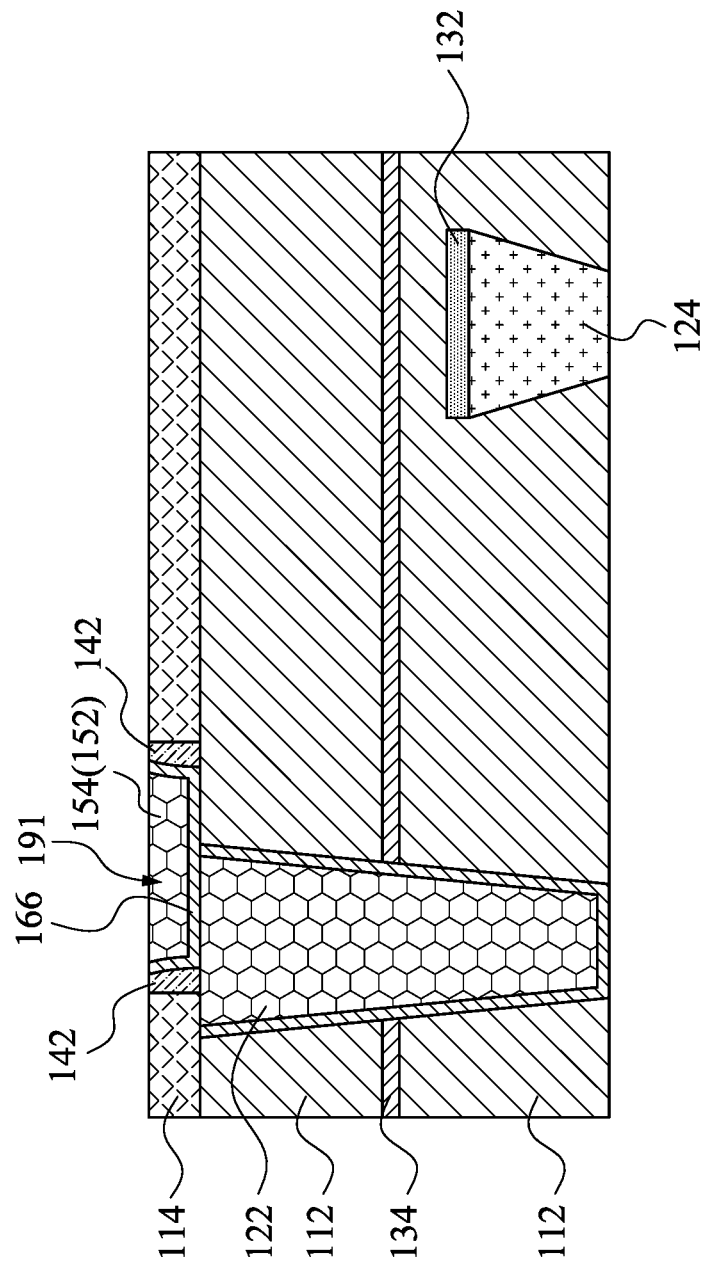

Then, as shown in FIG. 5 and FIG. 6, upper portions of the barrier layer 166 and the conductive layer 152 are removed through a removal process. In some embodiments, the barrier layer 166 and the conductive layer 152 over burden are removed by a chemical mechanical polishing (CMP) process. In some embodiments, when the conductive layer 152 is made of copper (Cu), the CMP slurry is made of, for example, a mixture of suspended abrasive particles, an oxidizer, and a corrosion inhibitor, and the CMP slurry is acidic. A two-step CMP process may be used to remove the excess conductive layer 152 and the excess barrier layer 166. In the first step, the abrasive will remove the excess conductive layer 152 without disturbing the underlying barrier layer 166. In the second step, the excess barrier layer 166 will be removed. After the CMP process, at least one partial landing pad 154 (the conductive layer 152) is formed in the opening 191, and the partial landing pad 154 is surrounded by the etch stop spacer 142. In other words, the etch stop spacer 142 is disposed in the dielectric layer 114, and the etch stop spacer 142 is disposed between the dielectric layer 114 and the partial landing pad 154. In some embodiments, the thickness (height) of the dielectric layer 114, the barrier layer 166, the etch stop spacer 142, and the partial landing pad 154 is in a range from about 50 Å to about 500 Å.

Specifically, as shown in FIG. 6, a width of the partial landing pad 154 increases or remains constant as a height of the partial landing pad 154 increases. That is, a top surface of the partial landing pad 154 has a width greater than or substantially equal to that of a bottom surface of the partial landing pad 154. In other words, the width of the top surface of the partial landing pad 154 is not less than that of the bottom surface of the partial landing pad 154. In some embodiments, the sidewall of the partial landing pad 154 is an inwardly curved surface. In some other embodiments, the sidewall of the partial landing pad 154 is substantially vertical to the top surface of the partial landing pad 154.

In some embodiments, at least one surface of the etch stop spacer 142 facing the sidewall of the partial landing pad 154 is an outwardly curved surface. In some other embodiments, at least one surface of the etch stop spacer 142 facing the sidewall of the partial landing pad 154 is substantially vertical to the top surface of the partial landing pad 154.

Figure 7:
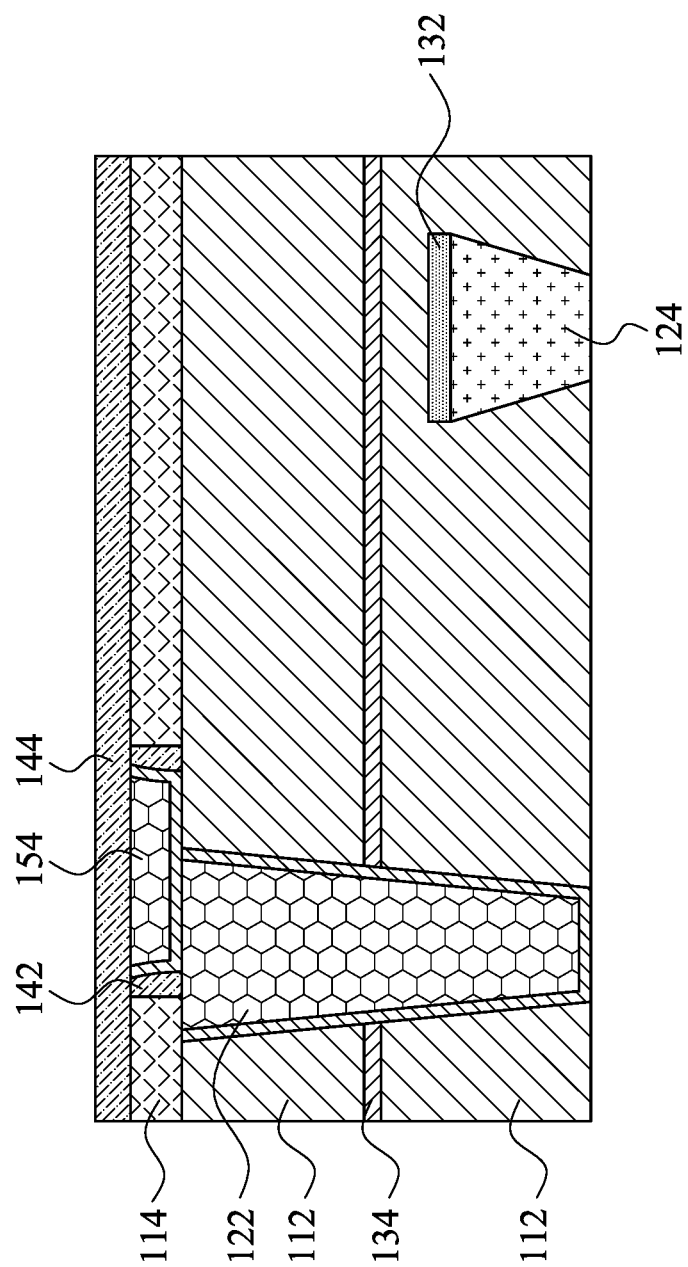

Reference is made to FIG. 7. An etch stop layer 144 is formed on the dielectric layer 114, the etch stop spacer 142, and the partial landing pad 154, and the etch stop layer 144 is in contact with at least a part of the top surface of the partial landing pad 154. The etch stop spacer 142 and the etch stop layer 144 may be made of substantially the same material, and thus the etch stop spacer 142 and the etch stop layer 144 may be considered the same layer. In some embodiments, the etch stop layer 144 is made of a carbon-rich material, such as silicon carbon nitride (SiCN). The etch stop layer 144 is formed by, for example, plasma-enhanced chemical vapor deposition (PECVD). In some embodiments, the etch stop layer 144 has a thickness in a range from about 50 Å to about 400 Å.

Figure 8:
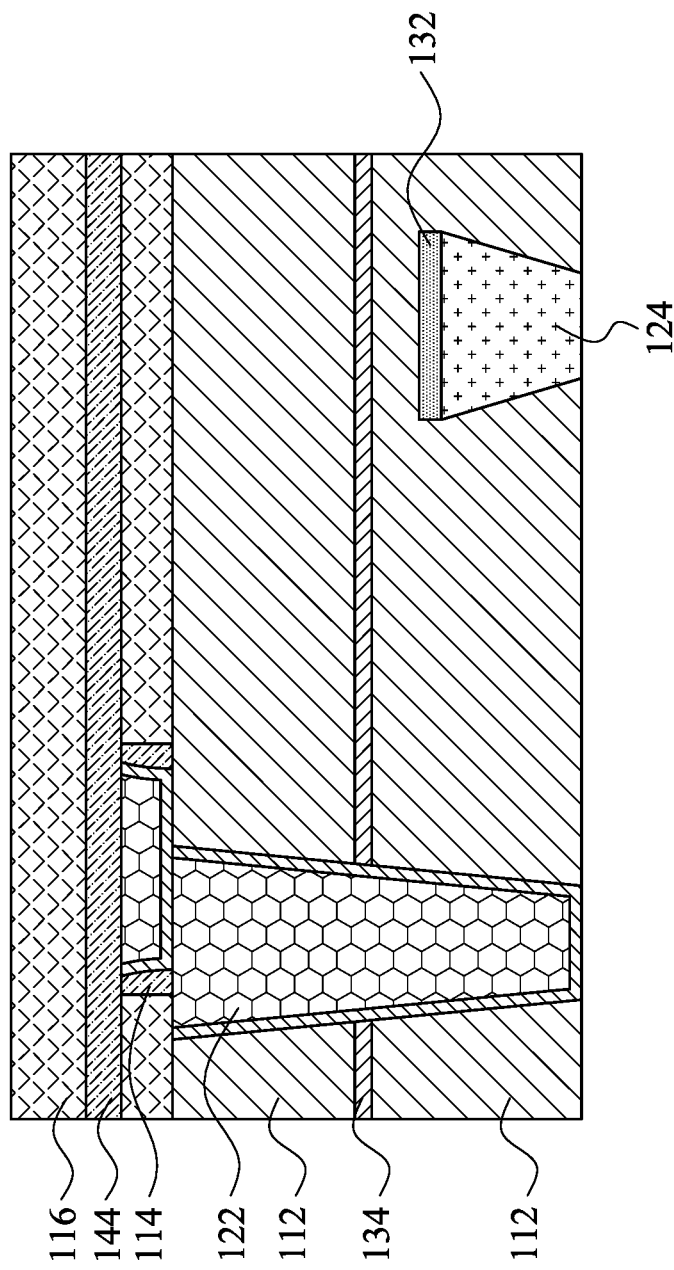

In FIG. 8, a dielectric layer 116 is formed on the etch stop layer 144. The dielectric layer 116 is made of a dielectric material, such as silicon oxide, silicon nitride, silicon oxynitride, or combinations thereof. In some embodiments, the dielectric layer 116 is made of a low-κ dielectric material, such as hydrogenated carbon-doped silicon oxide (SiCOH), fluorosilicate glass (FSG), porous silicon oxide (i.e. the xerogel or the aerogel), nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, or combinations thereof. The dielectric layer 116 is formed by, for example, chemical vapor deposition (CVD), spin coating, or combinations thereof.

Figure 9:
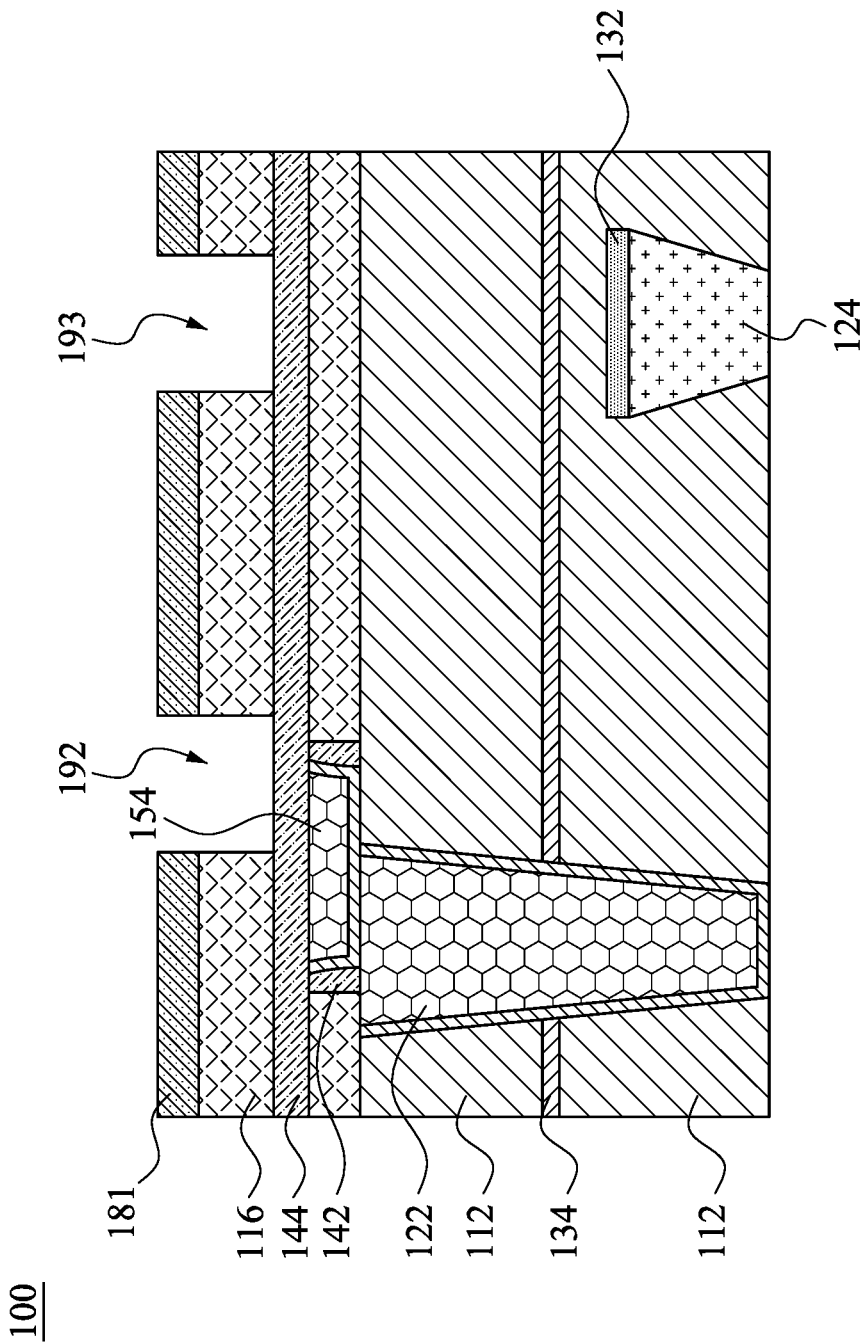

In FIG. 9, holes 192 and 193 are formed in the dielectric layer 116. The holes 192 and 193 are formed by a photolithography and etching process. The photolithography and etching process includes photoresist application, exposure, developing, and etching. A photoresist 181 is applied onto the dielectric layer 116 by, for example, spin coating. The photoresist 181 is then prebaked to drive off excess photoresist solvent. After prebaking, the photoresist 181 is exposed to a pattern of intense light.

The intense light is, for example, a G-line with a wavelength of about 436 nm, an I-line with a wavelength of about 365 nm, a krypton fluoride (KrF) excimer laser with a wavelength of about 248 nm, an argon fluoride (ArF) excimer laser with a wavelength of about 193 nm, a fluoride ($F_2$) excimer laser with a wavelength of about 157 nm, or combinations thereof. A space between the final lens of the exposure tool and the photoresist surface may be filled with a liquid medium that has a refractive index greater than one during the exposure to enhance the photolithography resolution. The exposure to light causes a chemical change that allows some of the photoresist 181 soluble in a photographic developer.

Then, a post-exposure bake (PEB) may be performed before developing to help reduce standing wave phenomena caused by the destructive and constructive interference patterns of the incident light. The photographic developer is then applied onto the photoresist 181 to remove the some of the photoresist 181 soluble in the photographic developer. The remaining photoresist 181 is then hard-baked to solidify the remaining photoresist 181.

At least two portions of the dielectric layer 116 which is not protected by the remaining photoresist 181 are etched to form the holes 192 and 193. The etching of the dielectric layer 116 may be dry etching, such as reactive ion etching (RIE), plasma enhanced (PE) etching, or inductively coupled plasma (ICP) etching. In some embodiments, when the dielectric layer 116 is made of silicon oxide, fluorine-based RIE can be used to form the holes 192 and 193, and the gas etchant used to dry etch the dielectric layer 116 is, for example, $CF_4/O_2$, $ClF_3$, $CCl_3F_5$, $SF_4/O_2$, or combinations thereof.

The etch stop layer 144 and the dielectric layer 116 have different etch resistance properties. In some embodiments, the etch stop layer 144 is made of a material which has higher etch resistance to the etchant used to etch the holes 192 and 193 than that of the dielectric layer 116. Therefore, the etching of the dielectric layer 116 is stopped by the etch stop layer 144 without overetching.

Figure 10:
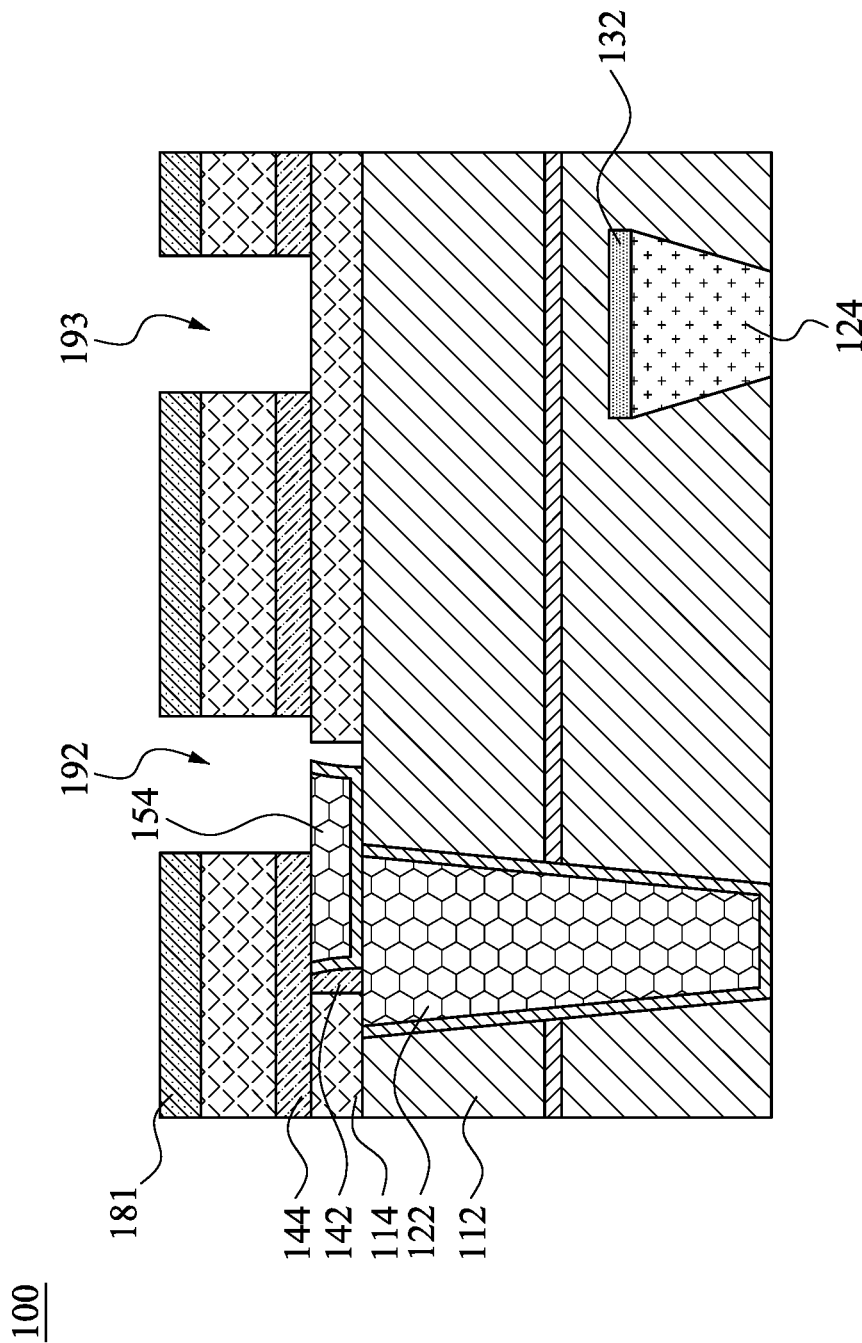

Reference is made to FIG. 9 and FIG. 10. The etch stop spacer 142 and the etch stop layer 144 exposed by the holes 192 and 193 are removed through an etching process to expose the dielectric layer 114 and the partial landing pad 154. Specifically, the etch stop spacer 142 and the etch stop layer 144 may be removed by $O_2$ plasma etching, $N_2$ plasma etching, $H_2$ plasma etching, or combinations thereof.

The etch stop spacer 142 and the etch stop layer 144 have different etch resistance properties than those of the dielectric layers 112 and 114 and the partial landing pad 154. In some embodiments, the dielectric layers 112 and 114 and the partial landing pad 154 are made of a material which has higher etch resistance to the etchant used to etch the etch stop spacer 142 and the etch stop layer 144. Therefore, the etching of the etch stop spacer 142 and the etch stop layer 144 is stopped by the dielectric layers 112 and 114 and the partial landing pad 154 without overetching.

Figure 11:
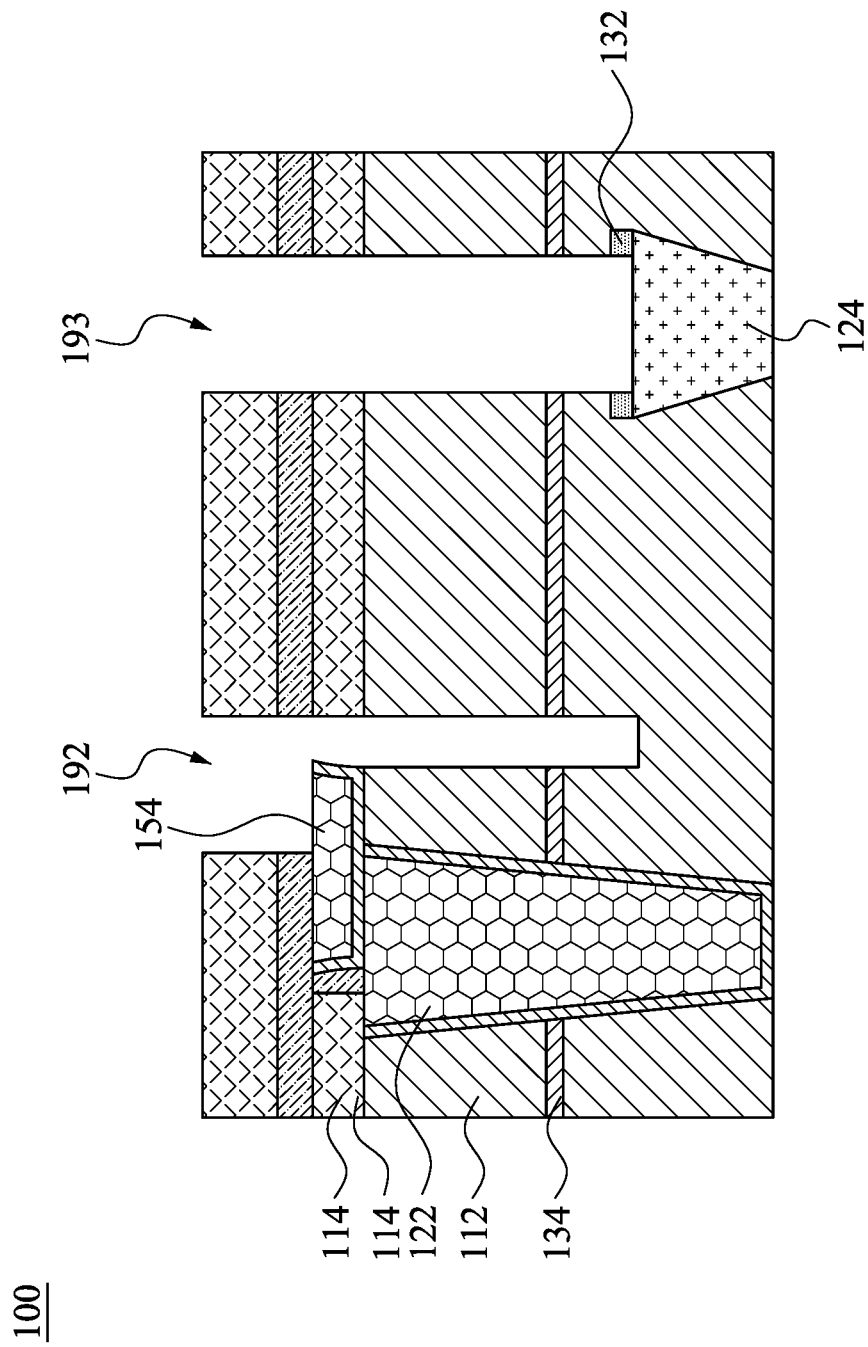

As shown in FIG. 10 and FIG. 11, the holes 192 and 193 are further deepened in the dielectric layers 112 and 114, the middle CESL 134, and the hard mask layer 132 to expose the conductor 124. The holes 192 and 193 are deepened by an etching process. The etching process may be dry etching, such as reactive ion etching (RIE), plasma enhanced (PE) etching, or inductively coupled plasma (ICP) etching. In some embodiments, fluorine-based RIE can be used to deepen the holes 192 and 193, and the gas etchant includes, for example, $CF_4/O_2$, $ClF_3$, $CCl_3F_5$, $SF_4/O_2$, or combinations thereof. After the holes 192 and 193 are deepened, the photoresist 181 is removed. Then, sputter cleaning process is performed to remove some residue materials generated during the etching process.

The conductor 124 and the partial landing pad 154 have different etch resistance properties than those of the dielectric layers 112 and 114, the middle CESL 134, and the hard mask layer 132. In some embodiments, the conductor 124 and the partial landing pad 154 are made of a material which has higher etch resistance to the etchant used to etch the dielectric layers 112 and 114, the middle CESL 134, and the hard mask layer 132. Therefore, the etching of the dielectric layers 112 and 114, the middle CESL 134, and the hard mask layer 132 is stopped by the conductor 124 and the partial landing pad 154 without overetching.

Figure 12:
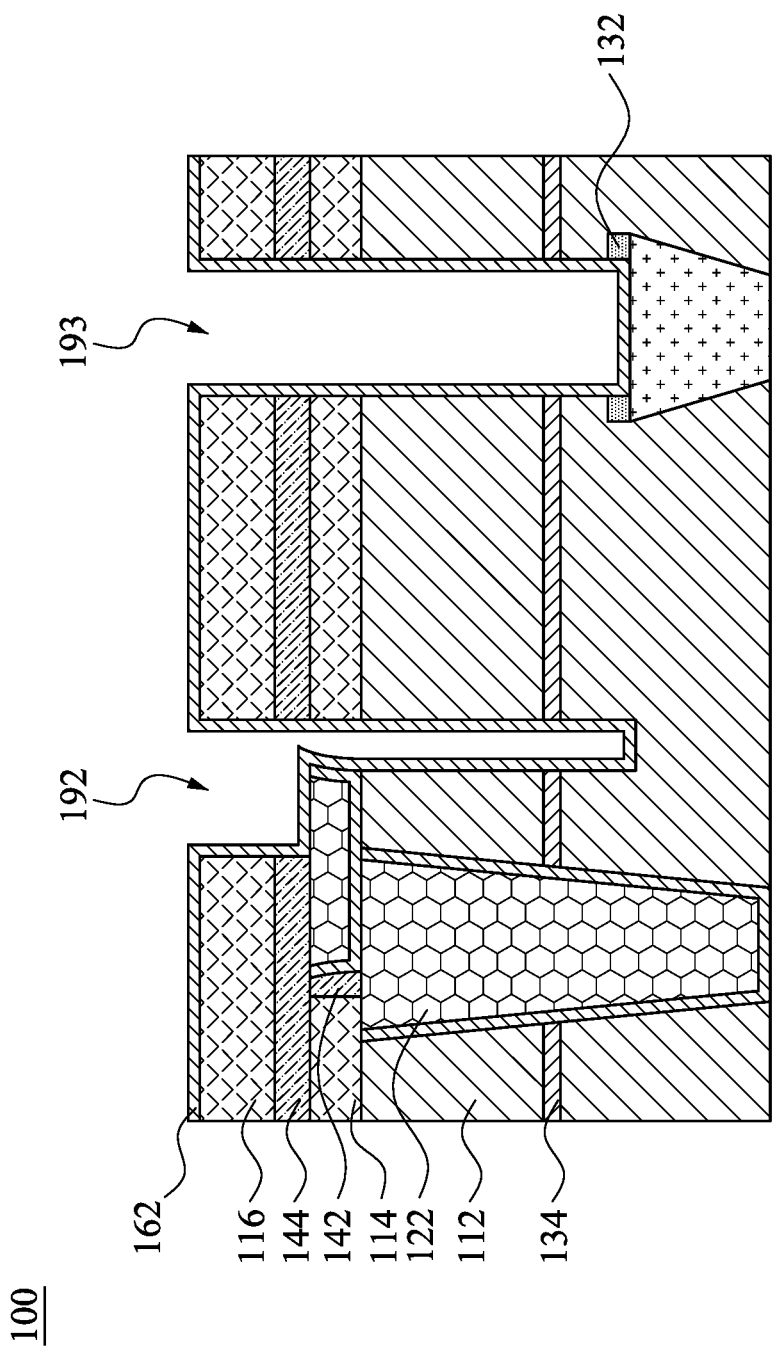

Reference is made to FIG. 12. A barrier layer 162 is formed on at least one sidewall and a bottom surface of the hole 192, at least one sidewall and a bottom surface of the hole 193, and a top surface of the dielectric layer 116. Specifically, the barrier layer 162 is formed on a top surface and at least one sidewall of the partial landing pad 154. Since the holes 192 and 193 have a low aspect ratio, the barrier layer 162 can be formed in the holes 192 and 193 with at least acceptable step coverage. The barrier layer 162 is made of a material which can adhere a conductor in the holes 192 and 193 to the dielectric layers 112, 114, and 116, the hard mask layer 132, the middle CESL 134, and the etch stop layer 144 and stop diffusion of the conductor into the dielectric layers 112, 114, and 116. In some embodiments, when the conductor in the holes 192 and 193 is made of copper (Cu), the barrier layer 162 is made of, for example, tantalum nitride (TaN), tantalum (Ta)/TaN, Ta, other transition metal based materials, or combinations thereof. In some other embodiments, when the conductor in the holes 192 and 193 is made of aluminum (Al), the barrier layer 162 is made of, for example, titanium nitride (TiN), titanium (Ti)/TiN, Ti, other transition metal based materials, or combinations thereof. The barrier layer 162 is formed by, for example, physical vapor deposition (PVD), ionized physical vapor deposition (IPVD), atomic layer deposition (ALD), chemical vapor deposition (CVD), or combinations thereof.

Figure 13:
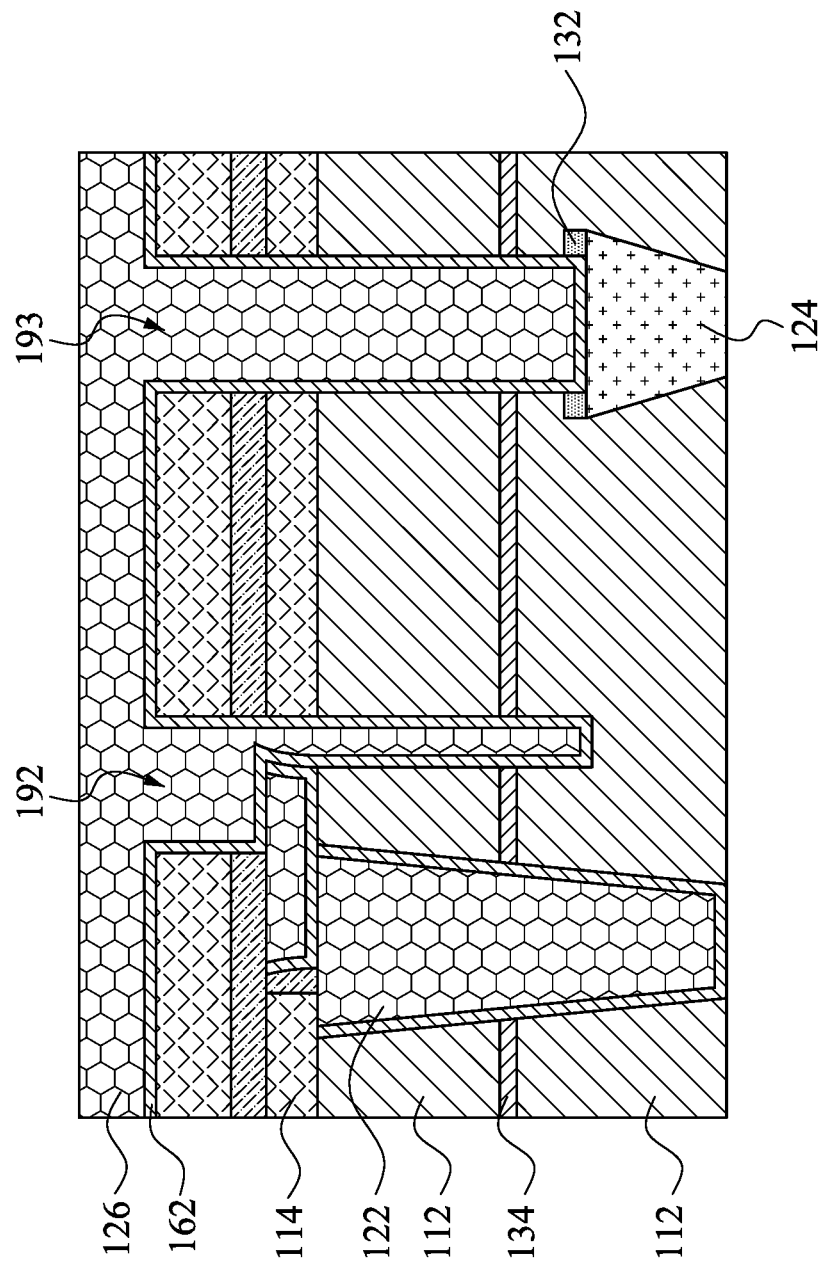

Reference is made to FIG. 13. A conductive layer 126 overfills the holes 192 and 193. The conductive layer 126 is made of metal, such as copper (Cu), aluminum (Al), tungsten (W), nickel (Ni), cobalt (Co), titanium (Ti), platinum (Pt), tantalum (Ta), or combinations thereof. The conductive layer 126 is formed by, for example, electrochemical deposition, physical vapor deposition (PVD), chemical vapor deposition (CVD), or combinations thereof.

Figure 14:
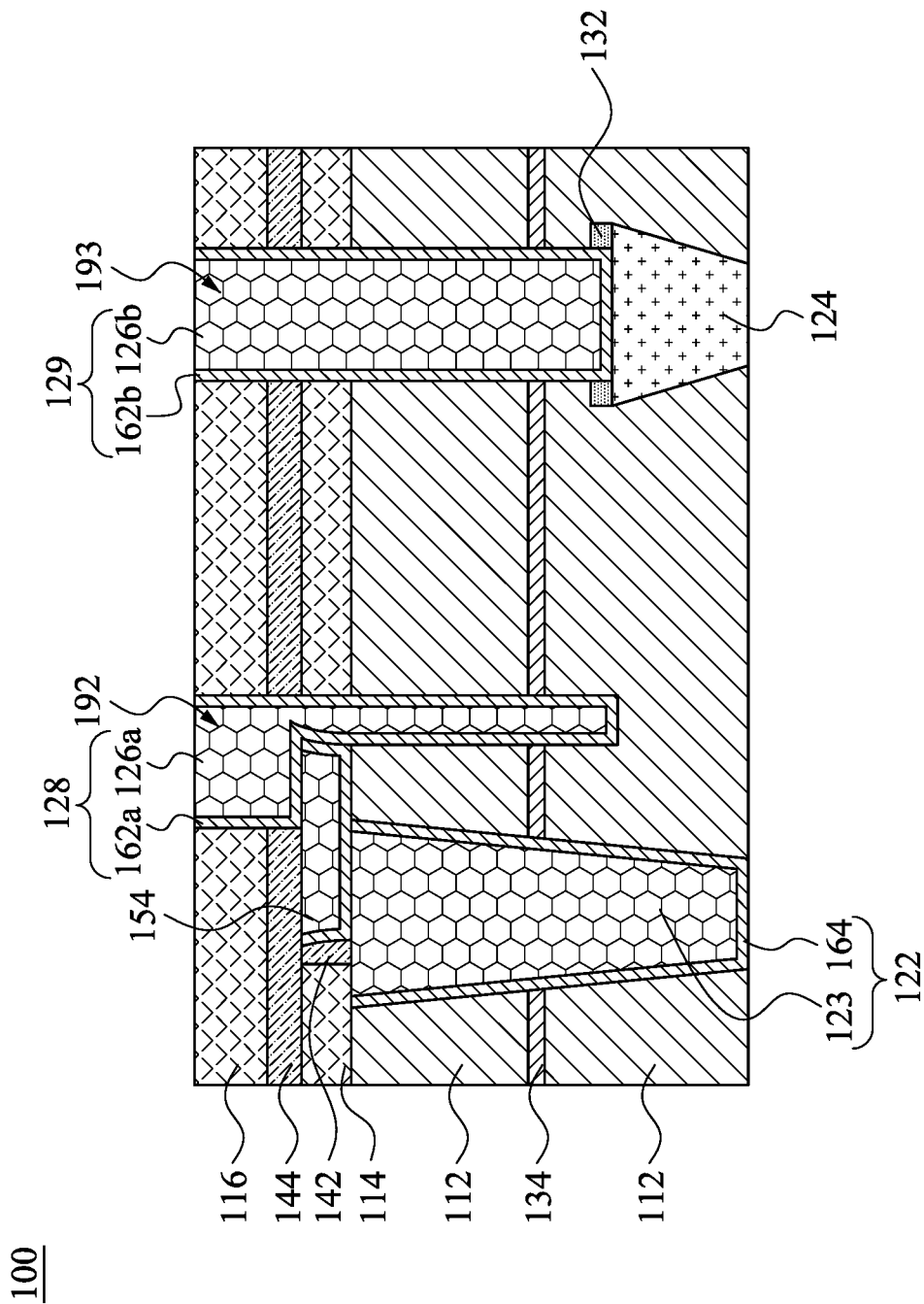

As shown in FIG. 13 and FIG. 14. The excess conductive layer 126 and barrier layer 162 outside of the holes 192 and 193 are removed through a removal process. In some embodiments, the conductive layer 126 and barrier layer 162 over burden are removed by a chemical mechanical polishing (CMP) process. In some embodiments, when the conductive layer 126 is made of copper (Cu), the CMP slurry is made of, for example, a mixture of suspended abrasive particles, an oxidizer, and a corrosion inhibitor, and the CMP slurry is acidic. A two-step CMP process may be used to remove the excess conductive layer 126 and barrier layer 162. In the first step, the abrasive will remove the bulk conductive layer 126 without disturbing the barrier layer 162. In the second step, the residual excess conductive layer 126 and the excess barrier layer 162 will be removed. After the CMP process, a conductive via 128, which includes a part 126a of the conductive layer 126 and a part 162a of the barrier layer 162, is formed in the hole 192, and a conductive via 129, which includes a part 126b of the conductive layer 126 and a part of 162b of the barrier layer 162, is formed in the hole 193. The conductive via 128 is electrically connected to the partial landing pad 154, and the conductive via 129 is electrically connected to the conductor 124.

Specifically, the part 162a of the barrier layer 162 is disposed between the sidewall of the partial landing pad 154 and the part 126a of the conductive layer 126. In some embodiments, at least one surface of the part 162a of the barrier layer 162 facing the sidewall of the partial landing pad 154 is an outwardly curved surface. In some other embodiments, at least one surface of the part 162a of the barrier layer 162 facing the sidewall of the partial landing pad 154 is substantially vertical to the top surface of the partial landing pad 154.

By forming the holes 192 and 193 in three operations, that is, forming the holes 192 and 193 in the dielectric layer 116 and further deepening the holes 192 and 193 in the etch stop layer 144 and the dielectric layer 114 and in the dielectric layers 112, the partial landing pad 154 will not be influenced by the forming the holes 192 and 193, such that the quality of the electrical connection between the partial landing pad 154 and the conductive via 128 will be improved. In addition, because the width of the partial landing pad 154 increases or remains substantially constant as the height of the partial landing pad 154 increases, some residue materials, which re-sputter during sputter cleaning process, are hard to be re-deposited on the sidewall of the partial landing pad 154. Therefore, there will be few residue materials disposed between the sidewall of the partial landing pad 154 and the conductive via 128, such that the quality of the electrical connection of the partial landing pad 154 and the conductive via 128 will be improved.

According to some embodiments of the present disclosure, a semiconductor structure includes a first dielectric layer, a first conductive via, a partial landing pad, a second dielectric layer, and a second conductive via. The first conductive via is disposed in the first dielectric layer. The partial landing pad is disposed on the first conductive via and the first dielectric layer, in which the partial landing pad has a top surface and a bottom surface, and the top surface of the partial landing pad has a width greater than or substantially equal to that of the bottom surface of the partial landing pad. The second dielectric layer is disposed on the partial landing pad. The second conductive via is disposed in the second dielectric layer and electrically connected to the partial landing pad.

According to some embodiments of the present disclosure, a semiconductor structure includes a first dielectric layer, a first conductive via, a partial landing pad, a second dielectric layer, a second conductive via, and at least one etch stop spacer. The first conductive via is disposed in the first dielectric layer. The partial landing pad is disposed on the first conductive via and the first dielectric layer. The second dielectric layer is disposed on the partial landing pad. The second conductive via is disposed in the second dielectric layer and electrically connected to the partial landing pad. At least one etch stop spacer is disposed on at least one sidewall of the partial landing pad.

According to some embodiments of the present disclosure, a method for manufacturing a semiconductor structure includes the following operations. A partial landing pad is formed on a bottom conductive via and a first dielectric layer. An etch stop layer is formed on the partial landing pad. A second dielectric layer is formed on the etch stop layer. At least one first hole is formed in the second dielectric layer. The first hole is deepened through the etch stop layer to expose at least a portion of the partial landing pad. A first upper conductor is formed in the first hole, such that the first upper conductor is electrically connected to the partial landing pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for manufacturing a semiconductor structure, the method comprising:
   forming a first dielectric layer and a bottom conductive via in the first dielectric layer;
   forming a second dielectric layer on the first dielectric layer;
   forming an opening in the second dielectric layer;
   forming at least one etch stop spacer on at least one sidewall of the opening;
   forming a partial landing pad in the opening on the bottom conductive via and the first dielectric layer;
   forming an etch stop layer on the partial landing pad;
   forming a third dielectric layer on the etch stop layer;
   forming at least one first hole in the third dielectric layer;
   deepening the first hole through the etch stop layer to expose at least a portion of the partial landing pad; and
   forming a first upper conductor in the first hole, such that the first upper conductor is electrically connected to the partial landing pad,
   wherein the deepening comprises removing the etch stop spacer exposed by the first hole.
2. The method of claim 1, further comprising:
   forming a barrier layer in the first hole and on a top surface and at least one sidewall of the partial landing pad before the forming the first upper conductor.
3. The method of claim 1, further comprising:
   sputter cleaning the first hole before the forming the first upper conductor.
4. The method of claim 1, wherein the deepening comprises:
   removing at least a portion of the etch stop layer by $O_2$ plasma etching, $N_2$ plasma etching, $H_2$ plasma etching, or combinations thereof.
5. The method of claim 1, further comprising forming a second hole in the third dielectric layer;
   deepening the second hole through the first dielectric layer and a hard mask layer to expose a bottom conductor; and
   forming a second upper conductor in the second hole, wherein the second upper conductor is electrically connected to the bottom conductor.
6. The method of claim 1, wherein the etch stop layer and the at least one etch stop spacer are made of a same material.
7. The method of claim 1, wherein the at least one etch stop spacer is made of a carbon-rich material.
8. A method comprising:
   forming a first conductive via in a first dielectric layer;
   depositing a second dielectric layer over the first conductive via and the first dielectric layer;

patterning the second dielectric layer to form a first opening, at least a portion of the first conductive via being exposed in the first opening;

forming spacers on sidewalls of the second dielectric layer in the first opening;

forming a first conductive pad in the remaining portion of the first opening between the spacers;

forming a third dielectric layer over the second dielectric layer, the first conductive pad, and the spacers;

etching the third dielectric layer with a first etching process to form a second opening, at least a portion of a top surface and a sidewall of the first conductive pad being exposed in the second opening; and forming a second conductive via in the second opening to electronically connect the second conductive via to the first conductive pad.

9. The method of claim 8, wherein the etching the third dielectric layer with the first etching process comprises:

etching at least one of the spacers to remove at least a portion of at least one of the spacers to expose at least a portion of a sidewall of the first conductive pad.

10. The method of claim 8, wherein the first etching process comprises $O_2$ plasma etching, $N_2$ plasma etching, $H_2$ plasma etching, or combinations thereof.

11. The method of claim 8 further comprising:

extending the second opening with a second etching process, the extended second opening extending into the first dielectric layer.

12. The method of claim 11, wherein etching the third dielectric layer with the first etching process to form the second opening further forms a third opening through the third dielectric layer, and wherein extending the second opening with a second etching process further extends the third opening into the first dielectric layer to expose a first conductive feature in the first dielectric layer.

13. The method of claim 12, wherein forming second conductive via in the second opening further forms a third conducive via in the third opening to electronically connect the third via to the first conductive feature.

14. The method of claim 12, wherein the first conductive feature is a gate for a transistor.

15. The method of claim 8, wherein the third dielectric layer and spacers are made of a same material.

16. The method of claim 15, wherein the third dielectric layer and spacers are made of a carbon-rich material.

17. The method of claim 8 further comprising:

sputter cleaning the second opening before the forming the second conductive via.

18. A method comprising:

forming a first conductive feature over a substrate;

forming one or more first dielectric layers over the first conductive feature and the substrate;

forming a first conductive via in and extending through the one or more first dielectric layers;

depositing a second dielectric layer over the first conductive via and the one or more first dielectric layers;

patterning the second dielectric layer to form a first opening, at least a portion of the first conductive via being exposed in the first opening;

forming spacers on sidewalls of the second dielectric layer in the first opening;

forming a first conductive pad in the remaining portion of the first opening between the spacers;

depositing an etch stop layer over the second dielectric layer, the first conductive pad, and the spacers;

depositing a third dielectric layer over the etch stop layer;

etching the third dielectric layer with a first etch process to form a second opening and a third opening, the etch stop layer being exposed in the second and third openings;

extending the second opening and the third opening with a second etching process to expose at least a portion of a top surface and a sidewall of the first conductive feature in the second opening;

extending further the second opening and the third opening with a third etching process, the further extended third opening exposing the first conductive feature, the further extended second opening extending into the one or more first dielectric layers; and forming a second conductive via in the second opening and a third conductive via in the third opening.

19. The method of claim 18, wherein the etch stop layer and spacers are made of a same material.

* * * * *